Figure 1:
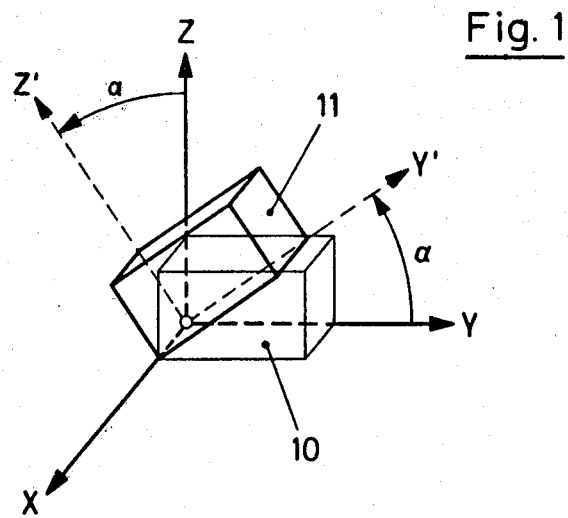

United States Patent [19]

Calderara

[11] 4,341,974
[45] Jul. 27, 1982

[54] PIEZOELECTRIC CRYSTAL ELEMENT FOR USE IN FORCE, PRESSURE AND ACCELERATION TRANSDUCERS

[75] Inventor: Reto Calderara, Bern, Switzerland

[73] Assignee: Kistler Instrumente AG, Winterthur, Switzerland

[21] Appl. No.: 154,022

[22] Filed: May 28, 1980

[30] Foreign Application Priority Data

Sep. 14, 1979 [CH] Switzerland ............... 8315/79

[51] Int. Cl.³ ............................................. H01L 41/08
[52] U.S. Cl. ................................... 310/360; 310/338; 310/329; 310/361
[58] Field of Search ............... 310/360, 361, 329, 338; 73/654, 727; 331/41, 65, 107 A

[56] References Cited

U.S. PATENT DOCUMENTS

| | | | |
|---|---|---|---|
| 3,409,464 | 11/1968 | Shiozawa | 310/360 |
| 3,714,476 | 1/1973 | Epstein | 310/360 X |
| 3,735,161 | 5/1973 | Perkins | 310/360 X |
| 3,863,497 | 2/1975 | Vaart | 310/313 B X |

*Primary Examiner*—Mark O. Budd
*Attorney, Agent, or Firm*—Craig and Antonelli

[57] ABSTRACT

A piezoelectric crystal element for use in force and pressure transducers and accelerometers, consisting of a monocrystalline cubic-polar material with electrode faces that intersect one of the crystallographic principal axes X,Y,Z at an angle $\alpha' = \arcsin \sqrt{p}$ and the other principal axes at $\beta' = \pm\frac{1}{2} \arccos p$, wherein $p=0$ for the piezoelectric orthoaxial shear effect, $p=\frac{1}{3}$ for the longitudinal piezoeffect and $p=1$ for the transverse piezoeffect.

6 Claims, 2 Drawing Figures

PIEZOELECTRIC CRYSTAL ELEMENT FOR USE IN FORCE, PRESSURE AND ACCELERATION TRANSDUCERS

The present invention pertains to piezoelectric crystal elements for use in force, pressure and acceleration transducers, and more particularly relates to the application of cubic polar crystals in longitudinal, transversal and shear transducer elements with maximum sensitivity and minimized cross-axis response.

It is known that piezoelectric measuring technology has developed into one of the most accurate and universal methods of analyzing dynamic force and pressure processes, accelerations and vibration conditions. Piezoelectric measuring transducers are distinguished from other systems in particular by their very high resonant frequency, extreme rigidity and small dimensions. They permit measurements with virtually no displacements, thus having only a minimum influence on the object to be measured. They also allow direct resolution of a vector into more than one component. A unique characteristic is the ability to measure variations which are smaller by several orders of magnitude than an already acting preload, because static preloads can easily be compensated electrically without affecting precision. Further advantages of piezoelectric measuring techniques are the outstanding linearity and freedom from hysteresis over measuring ranges which may extend over several orders of magnitude.

The development of measuring technology increasingly requires miniaturized high sensitivity transducers. However, miniaturization of a transducer generally implies a reduction of its sensitivity. This fact has supported the trend to provide piezoelectric transducers with integrated impedance-converting pre-amplifiers. Such amplifiers offer certain advantages in application because they avoid the use of extremely high insulating signal lines, as are necessary for conventional charge amplification.

In these integrated pre-amplifiers, the input is usually fed into the gate of a field effect transistor. Consequently, the input voltage per mechanical measuring unit should be maximized in order to attain an optimum signal-to-noise ratio. To achieve this, it is not sufficient to choose a material with a high piezoelectric field-strength coefficient $g_{m\mu}$, for in a transducer, the voltage sensitivity is reduced by the gate capacity $C_g$ of the field effect transistor and by the shunting capacity $C_s$ between the charged conductors from the piezoelectric element to the gate, and all the construction elements on counter-potential. The voltage sensitivity $S_v$ of a transducer may be represented by $$S_v = \frac{f_1 \cdot d_{m\mu}}{\epsilon_o \cdot \epsilon_{mm} \cdot f_2 + C_g + C_s(f_3)}$$

in which
$d_{m\mu}$ = piezoelectric charge coefficient of the active material
$\epsilon_o$ = permittivity of vacuum
$\epsilon_{mm}$ = dielectric constant of the active material, and
$f_{1,2,3}$ = factors depending on the geometry of the force-introducing, respectively of the active, respectively, of the capacity-forming elements This formula explains the fundamental problem of sensitivity reduction in miniaturized piezoelectric transducers with voltage-amplifying impedance converters.

As a transducer is geometrically reduced in scale, the gate capacity $C_g$ remains constant and the shunting capacity $C_s$ will decrease less than proportionally. Thus, the capacitive shunt will outweight the capacity of the piezoelectric material, and thereby become a limiting factor. As the formula shows, piezoelectric transducer materials must be selected both with a view for high dielectric constant as with regard to the piezoelectric coefficients. These data delimit the technically reasonable dimensions and application possibilities differently for every piezoelectric material.

The active elements of piezoelectric precision measuring cells consist very often of quartz crystal, because this material is rather predestined for such applications thanks to its excellent mechanical and electrical properties. Although quartz has a high piezoelectric field strength coefficient $g_{11}$, the relatively unfavorable data for $d_{11}$ and $\epsilon_{11}$ restrict severely its application in miniature transducers.

As alternative materials there are several ditrigonal-pyramidal crystals in use, such as lithium niobate, lithium tantalate and tourmaline. Crystals of this symmetry are pyroelectric. Since they suffer further grave drawbacks, such as strongly anisotropic thermal expansion, insufficient electric insulation at higher temperatures, or low piezoelectric sensitivity, they can replace quartz only in special cases.

Another group of piezoelectric transducer materials comprises the numerous ferroelectric ceramics which, by definition, are all pyroelectric too. In this group, the potential advantage of the partly rather high longitudinal sensitivity is cancelled out by the pyroelectricity which moves in parallel with it. For the transverse piezoelectric effect, the conditions are even more unfavorable. Particularly serious disadvantages of ferroelectric ceramics are given by time-dependence and non-linearity of their properties, which exclude their application where high measuring precision is required.

Hence, the development of measuring technology demands new crystals which offer suitable piezoelectric and dielectric characteristics without the aforementioned shortcomings. The first selection criterion for the required new group of piezoelectric materials shall be the absence of pyroelectricity. This already excludes the ten crystallographic symmetry classes containing singular polar axes.

Still further criteria can be defined by crystal symmetry arguments. With respect to the desired isotropy of the rigidity, tensile and thermal expansion properties, the symmetry should be as high as possible. However, it must not be so high that piezoelectricity vanishes, which already is the case if the crystal structure contains an inversion center. On the other hand, the symmetry also should not be too low because otherwise too many matrix elements of the piezoelectricity tensor would differ from zero and hence give rise to disturbing effects, such as cross-axis and mounting strain sensitivity. For instance, a shear transducer must not react on longitudinal forces and vice versa.

Conventional piezoelectric transducers for the measurement of forces, couples, pressures and accelerations are based on crystals or ceramics whose piezoelectricity tensors contain finite matrix elements for longitudinal, transverse and orthoaxial shear effects. These three loading modes are realized by innumerable sensor constructions. However, there exist also crystals whose symmetry lets appear exclusively synaxial shear coefficients in the matrix representation of the piezoelectricity tensors. Owing to the fact that in conventional transducer designs the synaxial shear mode is not suitable for converting mechanical signals into electrical ones by means of the direct piezoeffect, hitherto this kind of crystals has been considered as unsuited for the piezoelectric measuring technology.

Consequently, the aim of the present invention is to indicate ways, of how to make use of crystals with merely synaxial shear coefficients, in novel piezoelectric transducer elements that nevertheless feature longitudinal, transverse and orthoaxial shear modes.

The reasoning on which the present invention is based, may be summarized as follows: The general equation of the state for the direct piezoelectric effect is of course:

$$D_m = \sum_{\mu=1}^{6} (d_{m\mu} \cdot T_\mu) + \sum_{n=1}^{3} (\epsilon_{mn}^T \cdot E_n)$$

in which:
D: dielectrical displacements (charge per unit area)
d: piezoelectric coefficients
ϵ: dielectric constants
E: electric field strengths
T: mechanical stresses (force per unit area)

The indices m and n denote the directional components of the dielectric displacement and field strength, respectively, related to the orthogonal crystal coordinates, and run from 1 to 3, corresponding to the axes X, Y, Z. The components of the elastic stress tensor are denoted analogously by the reduced indices $\mu$. As usual $T_1$, $T_2$, $T_3$ denote stresses parallel to, and $T_4$, $T_5$, $T_6$ shear stresses about the axes X, Y, Z.

Thus, the piezoelectric coefficients $d_{m\mu}$ constitute a tensor of the third order, which comprises 18 elements in the general case. The elements with $m=\mu$ represent the three longitudinal effects while the three elements with $m=(\mu-3)$ are designated as synaxial shear effects. Among the other matrix elements with $m \neq \mu$ the six with $\mu \leq 3$ represent the transverse piezoeffects and the six elements with $\mu > 3$ the orthoaxial shear effects.

With the crystal applications preferred herein, the contribution of the field strength vector to the dielectric displacement is practically negligible compared with the influence of the elastic stress tensor. Hence, only the latter will be taken into account in the following. Thus, the above relation for the direct piezoelectric effect of any material with exclusively synaxial shear effects may be expressed in a general matrix form as follows:

$$\begin{pmatrix} D_1 \\ D_2 \\ D_3 \end{pmatrix} = \begin{pmatrix} 0 & 0 & 0 & d_{14} & 0 & 0 \\ 0 & 0 & 0 & 0 & d_{25} & 0 \\ 0 & 0 & 0 & 0 & 0 & d_{36} \end{pmatrix} \times \begin{pmatrix} T_1 \\ T_2 \\ T_3 \\ T_4 \\ T_5 \\ T_6 \end{pmatrix}$$

These general conditions apply to six crystallographic symmetry classes. If further symmetry elements are added to the ones of the orthorhombic-bisphenoidal crystal class, the following relations will connect the piezo coefficients: in the tetragonal-scalenohedral class: ($d_{25}=d_{14}$); for tetragonal- and hexagonal-trapezohedral crystals ($d_{25}=-d_{14}$; $d_{36}=0$). For cubic-hexakistetrahedral and tetrahedral-pentagondodekahedral crystals, finally, one obtains: ($d_{14}=d_{25}=d_{36}$).

The latter two symmetry classes are summarized as cubic-polar classes and will be treated with special emphasis in the following. However, all the calculations can be executed analogously for the mentioned crystal classes of lesser symmetry as well, of course.

Nature possesses a wealth of minerals that belong to the cubic-polar crystal classes, such as, for example, zinc-blende ZnS and gersdorffite NiAsS.

There are also many crystals of these symmetry classes which can easily be grown synthetically. Several ones among them exhibit even remarkably strong piezoelectricity. Representative of these classes are, for instance, cadmium sulphide CdS and zinc selenide ZnSe, or sodium chlorate $NaClO_3$ and bismuth germanium oxide $Bi_{12}GeO_{20}$, respectively.

The last-mentioned substance shows rather favorable properties with respect to piezoelectric and dielectric constants as well as with respect to thermal and elastic data, thereby gaining potential interest for piezoelectric measurement technology.

Owing to its piezoelectric properties, bismuth germanium oxide, as other cubic-polar crystals, has found several technical applications, such as electro-optic modulators, ultrasonic resonators and delay lines, where its relatively low sound velocity and its high electromechanical coupling constant are useful. On this basis, configurations have even been proposed to enable an indirect measurement of pressures, forces or accelerations (compare, e.g., U.S. Pat. No. 3,863,497, Van de Vaart et al.). In this patent, a Rayleigh type wave is excited on the surface of a thin crystal cantilever by applying a high frequency voltage to an interdigital electrode array. The mechanical signal to be measured causes a flexion of the crystal and consequently a relative change in the wave propagation characteristics. The signal can thus be detected indirectly as a phase shift.

All those applications have in common resonator elements that consist of an axis-parallel crystal section in which an elastic oscillation is excited at a natural frequency through the inverse piezoelectric effect, in other words, by means of electric energy fed into the crystal. Consequently, the performance depends mainly on the electro-mechanical coupling constant, whereas the piezoelectric coefficients have merely subordinate significance as drive constants. Such crystal elements are piezoelectrically inactive as regards longitudinal, transverse and orthoaxial stress. The piezoelectric measuring transducer elements that are the object of the present invention, however, differ fundamentally from resonator devices by the fact that they are not fed with any electric input. By contrast, the mechanical signal to be measured is converted into a proportional electric output by the direct piezoelectric effect. Moreover, these measuring transducer elements are not operated at their resonance frequencies; on the contrary, constructive measures are even taken to eliminate natural resonances as extensively as possible.

Figure 2:
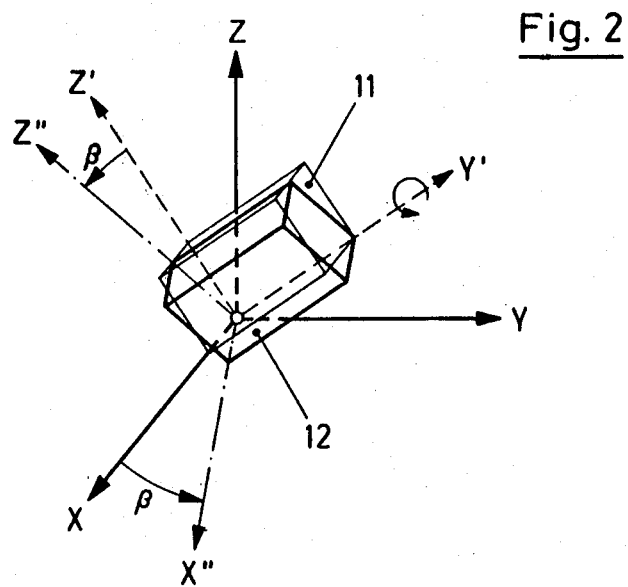

These and further objects, features and advantages of the present invention will become more apparent from the following description when taken in conjunction with the accompanying drawing which shows, for purposes of illustration only, one embodiment in accordance with the present invention, and wherein:

FIG. 1 is a perspective view of a crystal element rotated about its X-axis in accordance with the present invention; and FIG. 2 is a perspective view of the crystal element of FIG. 1 rotated about its Y'-axis in accordance with the present invention.

In order to reach the aim of using cubic-polar crystals in transducers based on the direct piezoelectric effect, it is necessary to process them into crystal elements that show piezoelectric sensitivity also for longitudinal, transverse and orthoaxial-shear stresses, respectively. To demonstrate how this is possible, the tensoral dependence on direction has to be taken into account in the equations of state for the direct piezoelectric effect.

To deduce the piezoelectric coefficients for any arbitrary direction, the orientation of the crystal element with respect to the Carthesian coordinate axes is expediently specified according to Gauss by successive rotations about axes at right angles to each other. The longitudinal, transverse and shear coefficients can so be derived as functions of the orientation angles $\alpha$, $\beta$, $\gamma$ from the non-reduced d-matrix (generally 27 elements with three-digit indices) by applying the symmetry operators of the crystal element to each of the rotations and by reducing back to two-digit indices after the multiplications with the well-known transformation matrices.

FIG. 1 illustrates the designations for the first rotation. Crystal section (10) is cut parallel to the crystallographic axes X, Y, Z and hence piezoelectrically inactive as to longitudinal, transverse and orthoaxial normal forces. Crystal element (11) is rotated about the X-axis by the orientation angle $\alpha > 0$. Its edges and transformed axes Y' and Z' generally need no longer coincide with any crystallographic symmetry element. These designations are analogously valid as well for differently shaped transducer elements, like circular disks cut obliquely with respect to crystallographic axes. Thus one obtains the following expressions for the orientation dependency of the piezoelectric coefficients:

$$d'_{11} = 0$$

$$d'_{12} = d_{14} \cdot \cos\alpha \cdot \sin\alpha$$

$$d'_{13} = -d_{14} \cdot \cos\alpha \cdot \sin\alpha$$

$$d'_{14} = d_{14}(\cos^2\alpha - \sin^2\alpha)$$

$$d'_{15} = d'_{16} = d'_{21} = d'_{22} = d'_{23} = d'_{24} = 0$$

$$d'_{25} = d_{25} \cdot \cos^2\alpha - d_{36} \cdot \sin^2\alpha$$

$$d'_{26} = (d_{25} + d_{36}) \cdot \cos\alpha \cdot \sin\alpha$$

$$d'_{31} = d'_{32} = d'_{33} = d'_{34} = 0$$

$$d'_{35} = -(d_{25} + d_{36}) \cos\alpha \cdot \sin\alpha$$

$$d'_{36} = d_{36} \cdot \cos^2\alpha - d_{25} \cdot \sin^2\alpha$$

Consequently, a single rotation yields crystal elements that have transverse as well as orthoaxial shear piezo effects. Evidently, cubic-polar crystals show maximum sensitivity at an orientation angle $\alpha = 45°$, whereby the synaxial shear effects disappear. Hence the d'-matrix for a cubic-polar X+45° crystal section takes the form:

$$d'_{m\mu} = \begin{pmatrix} 0 & \dfrac{d_{14}}{2} & \dfrac{-d_{14}}{2} & 0 & 0 & 0 \\ 0 & 0 & 0 & 0 & 0 & d_{14} \\ 0 & 0 & 0 & 0 & -d_{14} & 0 \end{pmatrix}$$

Obviously, in the orthoaxial shear mode there is no interference by transverse sensitivity and vice versa, as for $\alpha = 45°$ the force introduction takes place in diagonal planes, which by definition are identical with the electrode faces for the orthoaxial shear effect, and which are perpendicular to them for the transverse effect.

In order to achieve a crystal element which exhibits also longitudinal piezoelectric sensitivity, a further rotation about a transformed axis has to be performed.

FIG. 2 illustrates how crystal element (11), which was already turned about the X-axis, evolves by a second rotation about the orientation angle $\beta$, with respect to the transformed axis Y', into crystal element (12) which by now is inclined to all crystallographic principal axes X, Y, Z. For a transducer element (12) that may consist of any material belonging to one of the six mentioned symmetry classes with purely synaxial shear piezoeffect, the following formulae can be derived for the two-fold rotation about the axes X and subsequently Y':

$$d''_{11} = -(d_{14} + d_{25} + d_{36}) \cdot \cos\alpha \cdot \sin\alpha \cdot \cos\beta \cdot \sin^2\beta$$
$$d''_{12} = d_{14} \cdot \cos\alpha \cdot \sin\alpha \cdot \cos\beta$$
$$d''_{13} = -d_{14} \cdot \cos\alpha \cdot \sin\alpha \cdot \cos^3\beta + (d_{25} + d_{36}) \cos\alpha \cdot \sin\alpha \cdot \cos\beta \cdot \sin^2\beta$$
$$d''_{14} = d_{14} \cdot (\cos^2\alpha - \sin^2\alpha) \cdot \cos^2\beta - (d_{36} \cdot \cos^2\alpha - d_{25}\sin^2\alpha)\sin^2\beta$$
$$d''_{15} = 2 \cdot d_{14} \cdot \cos\alpha \cdot \sin\alpha \cdot \cos^2\beta \cdot \sin\beta - (d_{25} + d_{36})\cos\alpha \cdot \sin\alpha \cdot (\sin\beta - 2\cos^2\beta \cdot \sin\beta)$$
$$d''_{16} = (d_{25} \cdot \sin^2\alpha - d_{14}(\cos^2\alpha - \sin^2\alpha) - d_{36} \cdot \cos^2\alpha)\cos\beta \cdot \sin\beta$$
$$d''_{21} = (d_{36} \cdot \sin^2\alpha - d_{25}\cos^2\alpha) \cdot \cos\beta \cdot \sin\beta$$
$$d''_{22} = 0$$
$$d''_{23} = (d_{25} \cdot \cos^2\alpha - d_{36} \cdot \sin^2\alpha) \cdot \cos\beta \cdot \sin\beta$$
$$d''_{24} = (d_{25} + d_{36})\cos\alpha \cdot \sin\alpha \cdot \sin\beta$$
$$d''_{25} = (d_{25} \cdot \cos^2\alpha - d_{36} \cdot \sin^2\alpha)(\cos^2\beta - \sin^2\beta)$$
$$d''_{26} = (d_{25} + d_{36})\cos\alpha \cdot \sin\alpha \cdot \cos\beta$$
$$d''_{31} = (d_{25} + d_{36})\cos\alpha \cdot \sin\alpha \cdot \cos^2\beta \cdot \sin\beta - d_{14} \cdot \cos\alpha \cdot \sin\alpha \cdot \sin^3\beta$$
$$d''_{32} = d_{14} \cdot \cos\alpha \cdot \sin\alpha \cdot \sin\beta$$
$$d''_{33} = -(d_{14} + d_{25} + d_{36})\cos\alpha \cdot \sin\alpha \cdot \cos^2\beta \cdot \sin\beta$$
$$d''_{34} = (d_{14}(\cos^2\alpha - \sin^2\alpha) - d_{25} \cdot \sin^2\alpha + d_{36} \cdot \cos^2\alpha) \cdot \cos\beta \cdot \sin\beta$$
$$d''_{35} = (d_{25} + d_{36})\cos\alpha \cdot \sin\alpha \cdot (2\cos^2\beta \cdot \sin^2\beta - \cos\beta) + 2 \cdot d_{14} \cdot \cos\alpha \cdot \sin\alpha \cdot \cos\beta \cdot \sin^2\beta$$
$$d''_{36} = d_{14} \cdot (\sin^2\alpha - \cos^2\alpha) \cdot \sin^2\beta - (d_{36} \cdot \cos^2\alpha - d_{25} \cdot \sin^2\alpha) \cdot \cos^2\beta$$

An analysis of these equations shows that in cubic polar crystals the longitudinal sensitivity attains a maximum value if two conditions are fulfilled: For the first orientation angle evidently $\cos\alpha = \sin\alpha = \sqrt{2}/2$ is required, corresponding to $\alpha = 45°$. The second condition is satisfied by either $\sin\beta = \sqrt{3}/3$ or else $\sin\beta = \sqrt{2}/3$. Both values for the orientation angle, $\beta = 35.26439°$ and its complementary angle $\beta = 54.73561°$ are geometrically equivalent and correspond to crystal elements whose longitudinal direction, which of course is identical with the force introduction direction, is parallel to a space diagonal of an axis-parallel crystal cube. By definition, the electrode faces of a longitudinal element are perpendicular to the force introduction direction. Consequently, the angle $\alpha'$, $\beta'$, $\gamma' = \beta'$ at which the electrode faces are intersected by the crystallographic principal axes X, Y, Z can also be represented in a more universal and concise way by means of an elementary trigonometric transformation yielding $$\alpha' = \arc \sin \sqrt{p} \text{ and}$$

$$\beta' = \pm \tfrac{1}{2} \arc \cos p$$

in which the parameter p assumes the values ⅓ for the longitudinal piezo effect, the value 1 for the transverse piezoeffect, and the value 0 for the orthoaxial piezoeffect. Accordingly, all the orientations providing maximum piezoelectric sensitivity are specified, for cubic symmetry implies corollarily physical equivalence in case of cyclic exchange of the orientation angles.

The technical usability of a novel crystal section is not yet ensured, a priori, by an orientation of maximum sensitivity. As mentioned, practical applications require that disturbing side effects of a measuring transducer element, such as mounting strain- or cross-axis sensitivity are minimal. These problems are solved most easily by inserting the orientation angles $\alpha=45°$ and $\beta=35.26439°$ into the formulae for the piezoelectric coefficients of the two-fold rotated crystal element. The resulting matrix applies to any material of cubic-polar symmetry:

$$d''_{m\mu} = d_{14} \begin{pmatrix} -\tfrac{\sqrt{6}}{6} & \pm\tfrac{\sqrt{6}}{6} & 0 & 0 & \tfrac{\sqrt{3}}{3} & 0 \\ 0 & 0 & 0 & \tfrac{\sqrt{3}}{3} & 0 & \sqrt{\tfrac{2}{3}} \\ \tfrac{\sqrt{3}}{6} & \tfrac{\sqrt{3}}{6} & -\tfrac{\sqrt{3}}{3} & 0 & 0 & 0 \end{pmatrix}$$

Obviously a crystal section rotated about the axes X and Y' has its maximum longitudinal sensitivity in the twofold transformed direction Z''. Two more important facts emerge from the matrix representation: A crystal element with the described orientation has the advantage that shear forces from any direction will not interfere as lateral sensitivity effects with the longitudinal signal (because $d''_{34}=d''_{35}=d''_{36}=0$). Furthermore, the novel crystal element has the favorable quality of isotropy with regard to base strain, for $$d_{31}=d_{32}=-d_{33}/2.$$

As a typical application example of the invention may be mentioned a piezoelectric longitudinal element for use in pressure, acceleration and force transducers, which consists of a bismuth germanium oxide crystal. This material can easily be grown as big monocrystals from the melt by the Czochralski process.

The position of a crystallographic axis may be predetermined by the seed crystal. As piezoelectric measuring transducers are relatively demanding with respect to the orientation precision, the exact axes directions expediently are determined by an X-ray method. In order to obtain maximum longitudinal sensitivity, the crystal element is sectioned in such a way that the orientation angles $\alpha$ and $\beta$ according to FIGS. 1 and 2 are 45° and 35.26439°, respectively. The piezoelectric coefficients are easily calculated from the piezoelectric material constant of bismuth germanium oxide, $$d_{14}=3.88 \cdot 10^{-11} \, AsN^{-1}$$

The piezoelectric longitudinal sensitivity in the Z'' direction which results therefrom is:

$$d''_{33}=-22.4 \, pC/N$$

The other piezo coefficients have the following numerical values:

$$d''_{11}=-d''_{12}=-15.8 \, pC/N$$

$$d''_{15}=d''_{24}=+22.4 \, pC/N$$

$$d''_{26}=+31.7 \, pC/N$$

$$d''_{31}=d''_{32}=+11.2 \, pC/N$$

Hence, the transducer element made from bismuth germanium oxide according to this invention, features a longitudinal charge sensitivity which is higher by a factor of 9.7 as compared to a conventional quartz element.

Moreover, bismuth germanium oxide has a dielectric constant which is 8.7 times higher than that of quartz. This provides for the novel crystal element an additional advantage for the application in miniature transducers with integrated impedance-converting preamplifiers, if the shunt capacities are of the order of magnitude of the crystal capacity. Furthermore, bismuth germanium oxide is usable at higher temperatures, for in contrast to quartz crystals it tends neither to twinning nor to lattice transformations. Unlike ferro electric ceramics, it also does not have a Curie point.

The shape of a crystal element in accordance with the present invention does not need to correspond to the ashlar form like the one drawn in FIG. 2 to visualize better the axis directions. As all orientation formulae are independent of geometrical dimensions, rounding off the corners for instance would be without influence on piezoelectricity. In force, pressure or acceleration transducers thin circular disks with insulation facettes or washer-shaped crystals may be particularly suitable depending on construction.

In practice the force introduction surfaces are preferably machined plane-parallel. In the discussed example of a longitudinal transducer element, they are identical with the electrode faces, hence perpendicular to the transformed axis Z'' which corresponds with the direction of force introduction. The electrode surfaces customarily are metallized, e.g. by high-vacuum evaporation of gold or sputtered tantalum-platinum.

The described example is not to be understood in a restrictive sense. The deduced formulae show rather that the invention enables the design and production of crystal elements for use in longitudinal as well as transverse and orthoaxial shear transducers with orientations that provide maximum piezoelectric sensitivity, on the basis of any material that fulfills the given crystallographic symmetry conditions. Hence, I do not wish to be limited to the details described and illustrated herein but intend to cover all such changes and modifications thereof as are encompassed by the scope of the appended claims.

I claim:

1. A piezoelectric crystal element for use in force and pressure transducers and accelerometers, consisting of a monocrystalline cubic-polar material, comprising electrode faces that intersect one of the crystallographic principal axes X,Y, Z at an angle $\alpha'=\arc \sin \sqrt{p}$ and the other principal axes at $\beta'=\pm\tfrac{1}{2} \arc \cos p$, wherein p is substantially 0 for the piezoelectric orthoaxial shear effect, substantially ⅓ for the longitudinal and substantially 1 for the transverse piezoeffect, and substantially plane-parallel force introduction surfaces which essentially coincide with the electrode faces for shear and longitudinal effects, and which essentially correspond to diagonal planes perpendicular to the electrode faces for the transverse piezoeffect.

2. A piezoelectric crystal element according to claim 1, in which p=0 for the piezoelectric orthoaxial shear effect, p=⅓ for the longitudinal piezoeffect and p=1 for the transverse piezoeffect.

3. A piezoelectric crystal element according to claim 1 or 2, for converting forces, pressures and accelerations into electrical signals by the longitudinal direct piezoeffect, in which two substantially plane-parallel force introduction surfaces are intersected by the crystallographic principal axes at angles of about 35.26°.

4. A piezoelectric crystal element according to claim 1 or 2, for converting shear forces into electrical signals by the orthoaxial direct shear piezoeffect, in which two substantially plane-parallel force introduction surfaces acting as electrode faces are essentially parallel to one crystallographic principal axis and essentially diagonal to the other crystallographic principal axes.

5. A piezoelectric crystal element according to claim 1 or 2, for converting forces, pressures and accelerations into electric signals by the transverse direct piezoeffect, in which the electrode faces are essentially perpendicular to one of the crystallographic principal axes, and two substantially plane-parallel force-introduction surfaces essentially intersect the other principal axes as diagonal planes.

6. A piezoelectric crystal element according to claim 1 or 2, for converting mechanical signals into electrical signals at high temperatures, comprising monocrystalline bismuth germanium oxide as active material.

* * * * *